United States Patent
Nakajima

(10) Patent No.: US 7,065,719 B2
(45) Date of Patent: Jun. 20, 2006

(54) METHOD FOR DESIGNING A SYSTEM LSI

(75) Inventor: Hiroyuki Nakajima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 78 days.

(21) Appl. No.: 10/413,692

(22) Filed: Apr. 15, 2003

(65) Prior Publication Data
US 2003/0200511 A1 Oct. 23, 2003

(30) Foreign Application Priority Data
Apr. 19, 2002 (JP) .............................. 2002-117357

(51) Int. Cl.
*G06F 17/50* (2006.01)

(52) U.S. Cl. .......................................... 716/1; 716/18

(58) Field of Classification Search .................... 716/1, 716/17, 18; 703/13
See application file for complete search history.

(56) References Cited

U.S. PATENT DOCUMENTS

| | | | |
|---|---|---|---|
| 5,623,684 A | | 4/1997 | El-Ghoroury et al. |
| 5,867,400 A | * | 2/1999 | El-Ghoroury et al. .......... 716/1 |
| 6,026,228 A | * | 2/2000 | Imai et al. ..................... 716/18 |
| 6,138,229 A | | 10/2000 | Kucukcakar et al. |
| 6,233,540 B1 | * | 5/2001 | Schaumont et al. .......... 703/14 |
| 6,385,757 B1 | * | 5/2002 | Gupta et al. ..................... 716/1 |
| 6,477,683 B1 | * | 11/2002 | Killian et al. ................... 716/1 |
| 6,490,716 B1 | * | 12/2002 | Gupta et al. ................... 716/18 |
| 6,634,017 B1 | * | 10/2003 | Matsui et al. .................. 716/11 |

FOREIGN PATENT DOCUMENTS

| WO | WO 46704 | 8/2000 |
|---|---|---|
| WO | WO 01/98921 A1 | 12/2002 |

OTHER PUBLICATIONS

Alomary A., et al., "Peas—I: A Hardware/Software Co-design System for ASIPs", Design Automation Conference (1993), pp. 2-7.
Salcic, Z., et al., "FLIX environment for generation of custom-configurable machines In FRLDs for embedded applications", Microprocessors and Microsystems, (1999) vol. 23, pp. 8-9.
H. Nakajima, "A System LSI Design Method Based on a Semi-Custom Processor Design Technology Using C To HDL Behavior Synthesis", Proceedings of the 2002 IEICE General Conference, Mar. 7, 2002, vol. 2002, p. 94.
K. Wakabayashi, "C-Based SoC Design Flow and EDA Tools: An ASIC and System Vendor Perspective", IEEE Translations on Computer-Aided Design of Integrated Circuits and Systems, vol, 19, No. 12, Dec. 2000, pp. 1507-1522.

* cited by examiner

*Primary Examiner*—Leigh M. Garbowski
(74) *Attorney, Agent, or Firm*—Scully, Scott, Murphy & Presser, P.C.

(57) ABSTRACT

A method for designing a system LSI includes the step of defining, for each of instructions of the processor, a behavior function description and an instruction description specifying the behavior function description, and the step of synthesizing the instructions by behavior synthesis to define the processor. The behavior function description and the instruction description are separately stored in a database as design resources for the next design of a system LSI. The instruction description is retrieved as accompanied by the associated behavior function description from the database.

20 Claims, 6 Drawing Sheets

FIG. 4

```
1   #define ADD 0x0          /* adder */
2   #define SUB 0x1          /* subtract */
3   #define MOV 0x3          /* move data */
4   #define JMP 0x2          /* jump */                         ⎫
5   #define SET 0x4          /* set immediate data */          ⎬ INSTRUCTION CODE
6   #define USR 0xf          /* user defined inst */           ⎭ DEFINITIONS
7   reg(0:8) pc;             /* 8bit prog counter */
8   reg(0:16) memP[256]; /* 256 word program memory */         ⎫ MEMEORY RESOURCE
9   reg(0:8) memD[16];   /* 16 byte data memory */             ⎬ DEFINITIONS
10  reg(0:1) carry;          /* carry flag */                  ⎭
11  reg(0:1) zero;           /* zero flag */
12
13  process cpu ()
14  {
15      ter(0:4)opc,opr1,opr2,opr3,        /* opcode operand wire */
16      opc::opr1::opr2::opr3=memP[pc]; /* instruction fetch */   ⎫
17      switch(opc){/* instruction decode */                      ⎪
18          case ADD: op_add(opr1,opr2); pc++; break;             ⎪
19          case SUB: op_sub(opr1,opr2); pc++; break;             ⎬ INSTRUCTION DECODE
20          case MOV: op_mov(opr1,opr2); pc++; break;             ⎪ AND EXECUTION
21          case JMP: pc=opr1::opr2; break;                       ⎪
22          case SET: op_set(opr1,opr2,opr3); pc++; break;        ⎪
23          case USR: op_user(opr1,opr2,opr3); pc++; break;       ⎪
24          default: break;                                       ⎭
25      }
26  }
``` the stored resources as much as possible. The hardware IP is generally designed in consideration of reuse

METHOD FOR DESIGNING A SYSTEM LSI

BACKGROUND OF THE INVENTION (a) Field of the Invention

The present invention relates to a method for designing a system LSI (large-scale integrated circuit) and, more particularly, to a method for designing a system LSI by employing a software-hardware-collaborated (SHC) design system using a behavior synthesis. The present invention also relates to a recording medium for storing therein the software defining the method for designing such a system LSI.

(b) Description of the Related Art

In recent years, a system LSI, or system-on-chip LSI, is increasingly used which realizes all the circuit functions of a desired system on a single chip. In addition, along with the finer fabrication process of the semiconductor devices, the number of logic gates integrated on a system LSI has increased dramatically, wherein the system LSI has a higher processing performance accordingly.

The system LSIs are used for a variety of processings such as image processing, encryption, filtering, and decoding, wherein the input/output signals have a variety of formats, and a variety of algorithms are used for processing these signals. In addition, the system LSIs have a variety of throughputs depending on the performances requested for the processing. In the recent trend, the algorithms used in the system LSI become more and more complicated, and the throughputs for the processing are significantly improved.

For the reasons as described heretofore, the recent system LSIs are designed for dedicated processing for the signals used therein.

FIG. 6 shows a flowchart for designing a system LSI by using a conventional SHC design system. In general, in the SHC design system using a behavior synthesis, an algorithmic description D1 described in a general-purpose language such as C language, or another higher-level language such as a dedicated language used for the behavior level description is translated into a lower-level-language description, such as a logic synthesis RTL (register transfer level) description D9. The RTL description can be implemented as hardware by using hardware resources including memory devices such as a register, and processors such as an adder.

The algorithmic description D1 describes all the functions of the system LSI in a behavior level. If the most part of the functions of the algorithm description D1 are to be implemented by hardware, the system LSI has a larger circuit scale and is thus expensive, although the system LSI has a higher throughput for the processing. On the other hand, if the most part of the functions are to be implemented by software, the system LSI has a lower throughput, although the system LSI has a smaller circuit scale. Accordingly, in the initial stage of the design, as shown in FIG. 6, the functions described in the algorithmic description D1 are separated into two groups in consideration of the constraints (or settings) for the system LSI, including circuit scale, throughput performance for processing, cost etc. (step S201). The two groups include a first group implemented by hardware resources, and a second group implemented by software resources.

If all the hardware resources are designed for all the details thereof, the development for the hardware resources will take higher cost and longer time length. For this reason, hardware macros designed in the past and stored as hardware intellectual property (IP) are reused for the design, by utilizing the stored resources as much as possible. The hardware IP is generally designed in consideration of reuse feasibility and higher versatility, and thus is installed with ease in the architecture of the system LSI.

The hardware of processor is designed as a combination of a basic-instruction processor 15 such as a microprocessor for processing versatile calculations and a dedicated-instruction processor 16 dedicated to specific processings such as a signal input/output processing. A hardware IP designed before and stored in the database is generally used as the basic-instruction processor 15. The basic-instruction processor 15 is generally designed by another division in the semiconductor manufacturer other than the division which develops the system LSI, the another division being dedicated to designing processors by using a register transfer design technique. The description for the basic-instruction processor 15 is presented together with a simulation description D10a.

After the basic-instruction processor 15 to be used in the system LSI is determined, the design process advances to a design for the dedicated-instruction processor 16 (step S202). In the design for the dedicated-instruction processor 16, the functions thereof are described in a higher-level language. By behavior synthesis of descriptions for the dedicated-instruction processor, a RTL description D9b and a simulation description D10b of the dedicated-instruction processor are obtained (step S203). It is judged in step S204 whether or not the RTL description D9b of the dedicated-instruction processor 16 can realize a circuit scale within a setting previously established as a constraint for the system LSI.

If the circuit scale is above the setting, the process returns to step S201, wherein the design for the system LSI is iterated from the first. If it is judged in step S204 that the circuit scale is within the setting, the RTL description D9a of the basic-instruction processor 15 and the description D9b of the dedicated-instruction processor 16 are coupled together via the RTL description 9c of the buses (step S205).

Subsequently, in the software design, application programs 11 and a device driver 14 for operating the dedicated-instruction processor 16 from the basic-instruction processor 15 are defined in a high-level language (step S206). The application programs 11 and the device driver 14 are compiled in a compiler (compiler/assembler/linker) and translated into a machine-language instruction set 13 (step S207). The machine-language instruction set 13 thus obtained, the simulation descriptions D10a and D10b and the bus simulation description D10c are combined together to form an overall simulation description, which is input to an instruction set simulator (step S208), wherein a simulation is performed in an environment similar to the architecture of the system LSI.

By simulating the hardware and software in the instruction set simulator, it is examined or verified that there is no error in the design of the hardware and software (step S209). In step S209, the throughput performance in the time domain and the power consumption of the system LSI are also measured under the actual service condition, and it is judged whether or not the throughput thus measured satisfies the performance required of the system LSI (step S210). If the result of judgement is negative, the process returns to step S201, wherein the separation of functions into software and hardware groups is corrected. If the result of judgement is affirmative in step S210, the design for the system LSI is fixed, followed by performing logic synthesis of the RTL description D9a of the basic-instruction processor 15, the RTL description D9b of dedicated-instruction processor 16, and the bus RTL description D9c to determine the actual gate circuit of the system LSI.

The conventional design for a system LSI, as described above, uses the technique for adding the dedicated-instruction processor 16 executing new dedicated instructions to the basic-instruction processor 15 executing general instructions. The execution of the basic instructions and dedicated instructions in a single processor necessitates a design of a new processor each time a system LSI is to be designed. This raises a problem in that the development of such a new processor takes considerable cost and time length.

An "Xtensa" processor was recently proposed which can restructure a basic processor architecture in a user-specific LSI by changing the resources thereof, such as the memory size, based on the settings (or constraints) such as number of gates, throughput performance and power dissipation (refer to Design Wave Magazine 1999, December). The proposed processor allows a DSP unit or a dedicated instruction unit, such as a numerical calculation coprocessor, to be selected and added, and also allows use of an extended language such as a TIE language for definition of new dedicated instruction algorithms. However, in this processor, since the dedicated instructions are defined separately from the basic-instruction processor to be restructured, a new dedicated instruction cannot be added by defining the same with reference to a basic instruction now existing in the basic processor.

Another processor called VUPU processor is also known which has dedicated instructions obtained by behavior synthesis which translates the language of the behavior level description of the dedicated-instruction processor architecture into the RTL description. The VUPU processor can be operated by the instruction delivered from the basic-instruction processor (refer to Design Wave Magazine1999, December).

The proposed VUPU processor includes a PU section (basic section) for executing a P-instruction defined in the basic instructions and a VU section (dedicated section) for executing a V-instruction defined by combining a plurality of P-instructions. This reduces the time length for the design of processor compared to the case of design for a new processor, because it is sufficient in this technique only to add V-instructions in the processor for the design of a system LSI.

However, in the VUPU processor as described above, an interface is defined for communication between the PU section and the VU section, and in addition, the basic-instruction processor architecture and the dedicated-instruction processor architecture are separated from each other. Accordingly, if a V-instruction which includes therein a function similar to a P-instruction is desired for definition, it is not possible to use, in the desired V-instruction, a part of the functional block of the P-instruction although it is optimized for a hardware macro block. In addition, since the P-instructions are defined in a fixed architecture of the P-instruction set, some P-instructions which are not needed in a specific system LSI may be included therein depending the type of the specific system LSI.

SUMMARY OF THE INVENTION

It is therefore an object of the present invention to provide a method for designing a system LSI, which is capable of designing the instruction set of the processor in a flexible way and also reducing the time length and cost for designing the system LSI by using existing design resources.

It is another object of the present invention to provide a recording medium storing therein the software using the above method.

The present invention provides a method for designing a system LSI including a processor, the method including the steps of defining instructions of the processor, and synthesizing the instructions by behavior synthesis to design the processor, wherein at least one of the instructions defined by the defining step includes a behavior function description and an instruction description specifying the behavior function description.

In accordance with the method of the present invention, due to the division of the behavior function description from the instruction description which specifies the behavior function description, a plurality of instructions can be defined to use a common behavior function description, and yet the instruction description can effectively define all the algorithms and functions of the instruction because the instruction description specifies the associated behavior function description. This allows a higher versatility of the instructions, and allows a single behavior function description to be reused in a plurality of new instructions to reduce the time length and cost for the design of the instructions.

The present invention also provides a recording medium storing therein software defining the method of the present invention.

The above and other objects, features and advantages of the present invention will be more apparent from the following description, referring to the accompanying drawings.

BRIEF DESCRIPTION OF THE DRAWINGS

FIG. 4 is an algorithmic diagram showing an example of the processor description in the system LSI of FIG. 1.

PREFERRED EMBODIMENTS OF THE INVENTION

Figure 1:
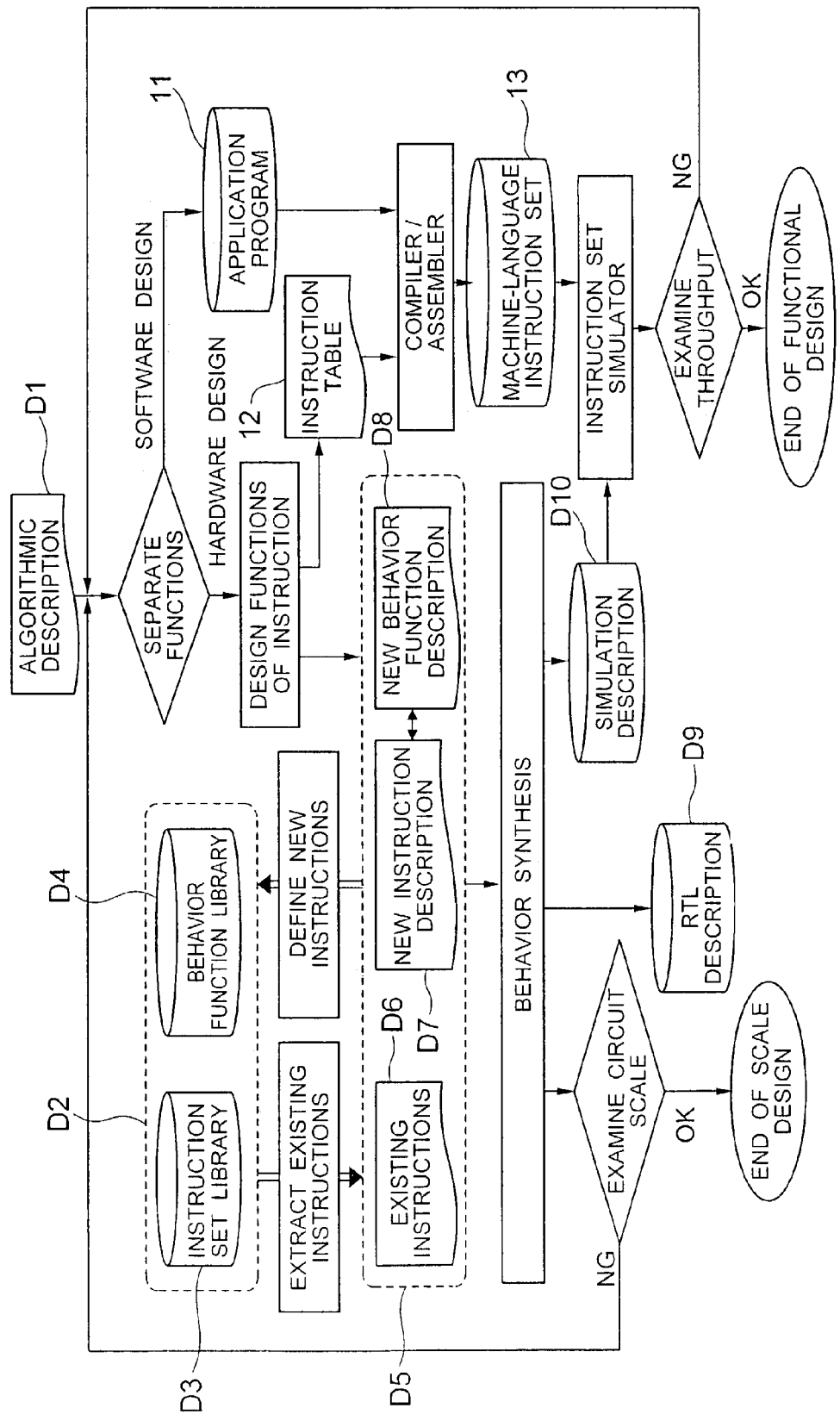
FIG. 1 is a schematic flowchart of a procedure in designing a system LSI according to an embodiment of the present invention.

In a preferred embodiment of the present invention, a designed instruction is stored in a database while separating the behavior function description of the instruction from the instruction description, which specifies the behavior function description. In this case, the instruction once designed is stored as a design resource and can be used for designing next LSIs. The instruction stored as the design resource can be extracted for use in designing a new instruction equivalent to the extracted instruction.

Since the instructions stored in the database are already passed by a behavior verification, the processor need not be subjected to a behavior verification for the extracted instructions and thus it is sufficient to verify new instructions, if any, designed for the processor in the subject system LSI. The new instruction may use an existing behavior function description extracted from the database, and in this case, the extracted behavior function need not be subjected to the behavior verification. That is, it is sufficient to verify the new instruction descriptions and the new behavior function descriptions, whereby the time length for the behavior verification of the processor can be reduced.

If the database storing therein the designed instructions is to be open to another party, such as a user, it is preferable to inhibit the another party from accessing to some contents in one or both of a first database section storing therein the instruction descriptions and a second database section storing therein the behavior function descriptions, and/or to inhibit the another party from updating one or both of the first database section and the second database section. If the database includes secret contents such as know-how or internal algorithms that should be kept in secrecy, the another party may be allowed to use the database while being inhibited from accessing to the secret sections and/or updating the database.

The second database section should store a plurality of behavior function descriptions in a hierarchical order. For example, in the hierarchical configuration, a behavior function includes (or specifies) a subordinate behavior function, which includes (or specifies) a further lower subordinate behavior function and so on. In such a case, a behavior function which has a higher possibility of reuse should be disposed in a lower hierarchical level for allowing a new behavior function to specify and use the lower behavior function, whereby the new behavior function can be prepared with ease.

The instruction description stored in the database should be retrieved therefrom as a complete instruction accompanied by a behavior function description. In the design for a system LSI, each of the instructions stored in the database and equivalent to the instructions to be used in the system LSI is extracted from the database, while including the instruction description and the behavior function description. This allows the processor to have only desired instructions.

After extracting existing instructions from the database and defining new instructions which are not stored in the database during the step of defining instructions, an instruction definition table is preferably prepared which tabulates all the instructions extracted from the database and all the new instructions thus defined. The instruction definition table is then delivered to a compiler/assembler/linker which targets the new processor for translating the instructions into the machine language. This allows preparation of the correct machine language for the instructions including the new instructions.

The instruction description should include an operand input interface section, an operand output interface section, an execution definition section which specifies the behavior function description for execution of the instruction, and an executed-result definition section which sets a flag based on the result of the execution conducted based on the execution definition section. This configuration of the instruction description allows the instruction description to be managed with ease in the database. In addition, a higher extendibility can be obtained for the instruction description.

The processor designed by the method of the present invention should preferably include a fixed logic circuit section having a function for executing the behavior function descriptions, and a programmable logic circuit section having a function for executing the instruction descriptions specifying the behavior function descriptions. In this case, after a processor is implemented as a hardware device, the design for the processor may be used for designing another processor, correcting a malfunction in another processor, or modifying the specification of another processor.

In such a case, the programmable logic circuit having the function for executing the behavior functions should be first designed, and then the programmable logic circuit should be programmed based on the instruction descriptions specifying the behavior function descriptions. Also in this case, after a processor is implemented as a hardware device, the design for the processor may be used for designing another processor, correcting a malfunction in another processor, or modifying the specification of another processor.

In the method of the present invention, the step of designing the processor by behavior synthesis of instructions should preferably yield a simulation description at the end of this step for allowing simulation of the designed processor. The simulation description allows an instruction set simulator to examine the function of the processor.

The method of the present invention preferably includes the step of simulating the system LSI by using the simulation description prepared in the processor design step and the software to be run on the processor.

The description for the processor should preferably use a C language, an extended C language, and/or an object-oriented language.

Now, the present invention is more specifically described with reference to accompanying drawings, wherein similar constituent elements are designated by similar reference numerals throughout the drawings.

Figure 2:
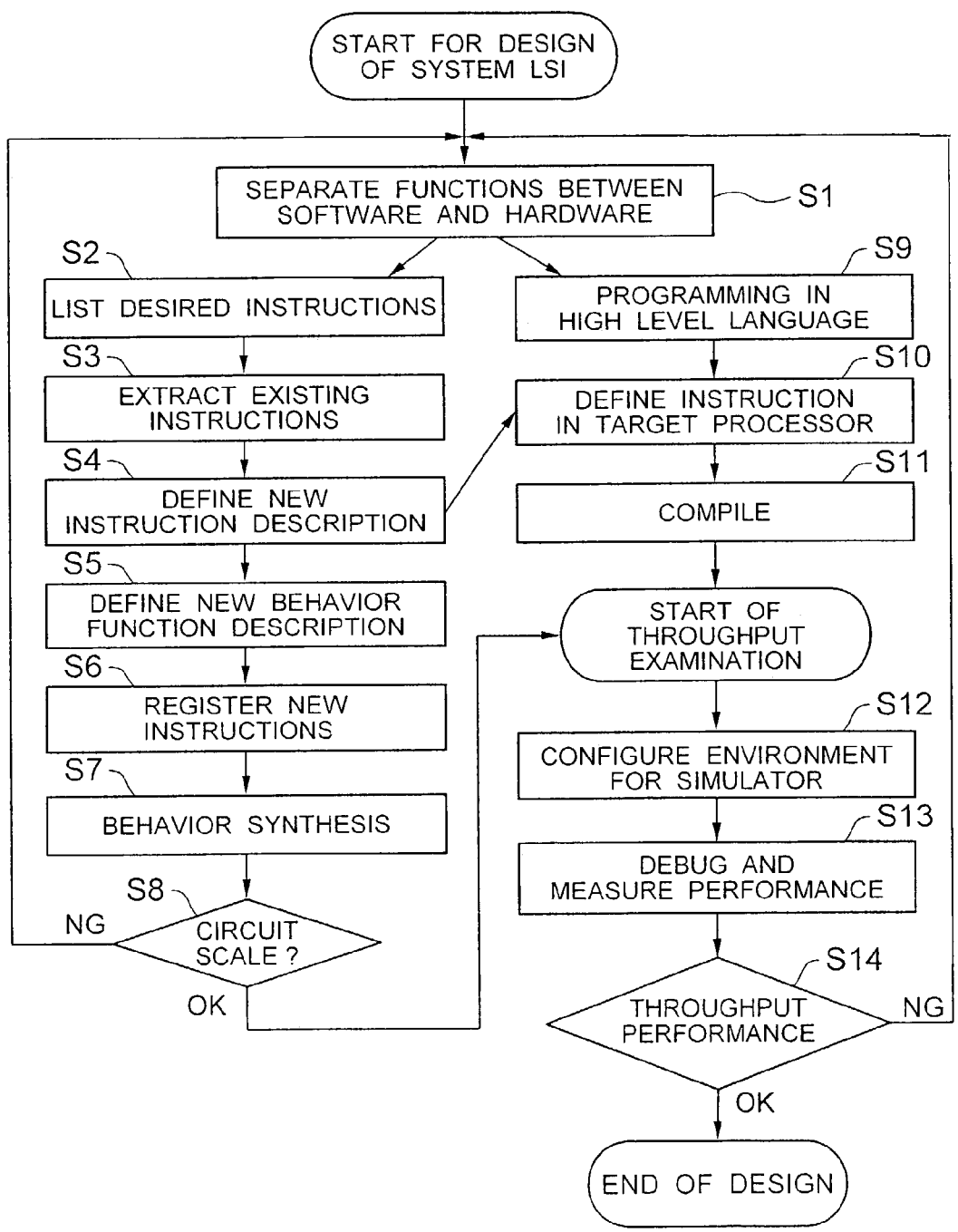
FIG. 2 is a flowchart of the method for designing the system LSI according to the embodiment.

Referring to. FIG. 1, there is shown a procedure for designing a system LSI according to an embodiment of the present invention. FIG. 2 shows the flowchart of the procedure of FIG. 1. In short, the method of the present embodiment employs a SHC design system using a behavior synthesis, as in the case of the conventional technique.

More specifically, the algorithmic description D1 shown in FIG. 1 defines all the functions of the system LSI in a general-purpose language, such as a C language, or another higher-level language, such as a dedicated language for the behavior-level description. The functions of the system LSI defined in the algorithmic description D1 are separated into two groups in consideration of the circuit scale, throughput performance for processing, power dissipation etc. (step S1 in FIG. 2), the two groups including a first group to be implemented by hardware resources, and a second group to be implemented by software resources. The design for the hardware group yields the instructions (functions) of the processor, whereas the design for the software group yields application programs 11 to be run on the processor designed as a new hardware resource.

If all the instructions of the processor are to be designed from the first in the design for the hardware resources, the design itself and the design verification for the processor are extremely complicated and consume a longer time and a higher cost. Thus, existing instructions stored in the database D2 are reused as much as possible in the design for the processor. The database D2 includes an instruction set library D3 and a behavior function library D4.

The instruction set library D3 stores therein the instruction descriptions each including an operand input interface section, an operand output interface section, an execution definition section and an executed-result definition section, as will be detailed later. The behavior function library D4 stores therein functional blocks as behavior function descriptions prescribing concrete processings, which are specified by the execution definition section of the instruction description. The instructions stored in the database D2 include versatile instructions generally used in most of the processors and specific instructions used in a specific processor designed in the past.

In the design for the processor, all the desired instructions, i.e., instructions needed for achieving the algorithms in the system LSI are listed (step S2). The existing instructions D6 equivalent to the listed desired instructions are first extracted or retrieved from the database D2, including instruction descriptions and the corresponding behavior function descriptions (step S3). The existing instructions D6 thus extracted are installed in the processor description D5. In this step, the behavior function descriptions are specified by the existing instructions for extraction from the behavior function library D4.

If a desired instruction needed for the processor is not found in the database D2, or if an execution by using a combination of existing instructions in a software configuration does not afford a desired throughput performance etc., then a new instruction description D7 is defined for executing a specific processing (step S4).

The functional blocks indicating concrete processing for the new instruction description D7 are then defined as a new behavior function description D8 (step S5). In this step, if a behavior function description defining a function equivalent to the functional block used by the new instruction exists in the behavior function library D4, the existing behavior function description is extracted from the behavior function library D4 and used as a new behavior function description D8 instead of or in addition to definition of a new behavior function. In other word, the new behavior function description D8 may be obtained by definition of a new behavior function or by combining one or more of existing behavior function descriptions extracted from the database D4 and a new behavior function defined for this purpose.

After the new instructions are designed, as described above, all the extracted instructions D5, the new instruction descriptions D7 and the new behavior function descriptions D8 are installed in the processor description D5, whereby the functional design of the processor is completed. At this stage, an instruction definition table D12 is prepared, from which a machine-language instruction set 13 suited to the processor thus designed is created by a compiler/assembler/linker during the software design.

After the functional design for the processor is completed, the new instruction descriptions D7 defined in step S4 and the new behavior function descriptions D8 defined in step S5 are stored and registered as design resources in the instruction set library D3 and the behavior function library D4, respectively (step S6). On the other hand, the processor description D5 is subjected to behavior synthesis to obtain an RTL description D9 suited for configuring a hardware and a simulation description D10 to be used for behavior verification of the processor in a clock-cycle level simulation.

The RTL description D9 obtained in step S7 is used for examining the circuit scale of the system LSI (step S8). If the circuit scale does not satisfy the constraints of the system LSI, the process returns to step S1, wherein the division of the algorithm description D1 into the hardware resources and the software resources is corrected. If the circuit scale satisfies the constraints, the configuration of the hardware resources of the processor is fixed.

In the design for the software resources, application programs D11 are described in a high-level language (step S9), thereby determining the operation of the system LSI (processor). After the details of the application programs 11 are fixed, instructions of the target processor are defined in step S10 with reference to the instruction definition table D12, and compiled in the compiler/assembler/linker to thereby obtain a machine-language instruction set 13 which the processor directly understand (step S11).

After the application programs D11 are fixed and translated into machine language, an instruction set simulator is prepared to examine and verify the behavior, throughput performance and power dissipation of the system LSI. In the instruction set simulator, an environment similar to the architecture of the system LSI is configured by using the machine-language instruction set D13 obtained in step S11 and the simulation description D10 obtained in step S7 (step S12).

The instruction set simulator debugs the processor description D5 and the application programs D11, and measures the throughput performance and power dissipation of the designed system LSI (step S13). It is judged in step S14 whether or not the throughput performance and power dissipation thus measured exceeds the constraints set beforehand. If one of these characteristics exceeds the constraint, the process returns to step S1, wherein the division of the algorithmic description into the hardware resources and the software resource is corrected. If the processor description D5 and the application programs D11 have no design error and if the system LSI satisfies the constraints of the throughput performance and power dissipation, the design for the system LSI is completed, whereby the processor and the application programs to be run on the processor are fixed.

Figure 3:
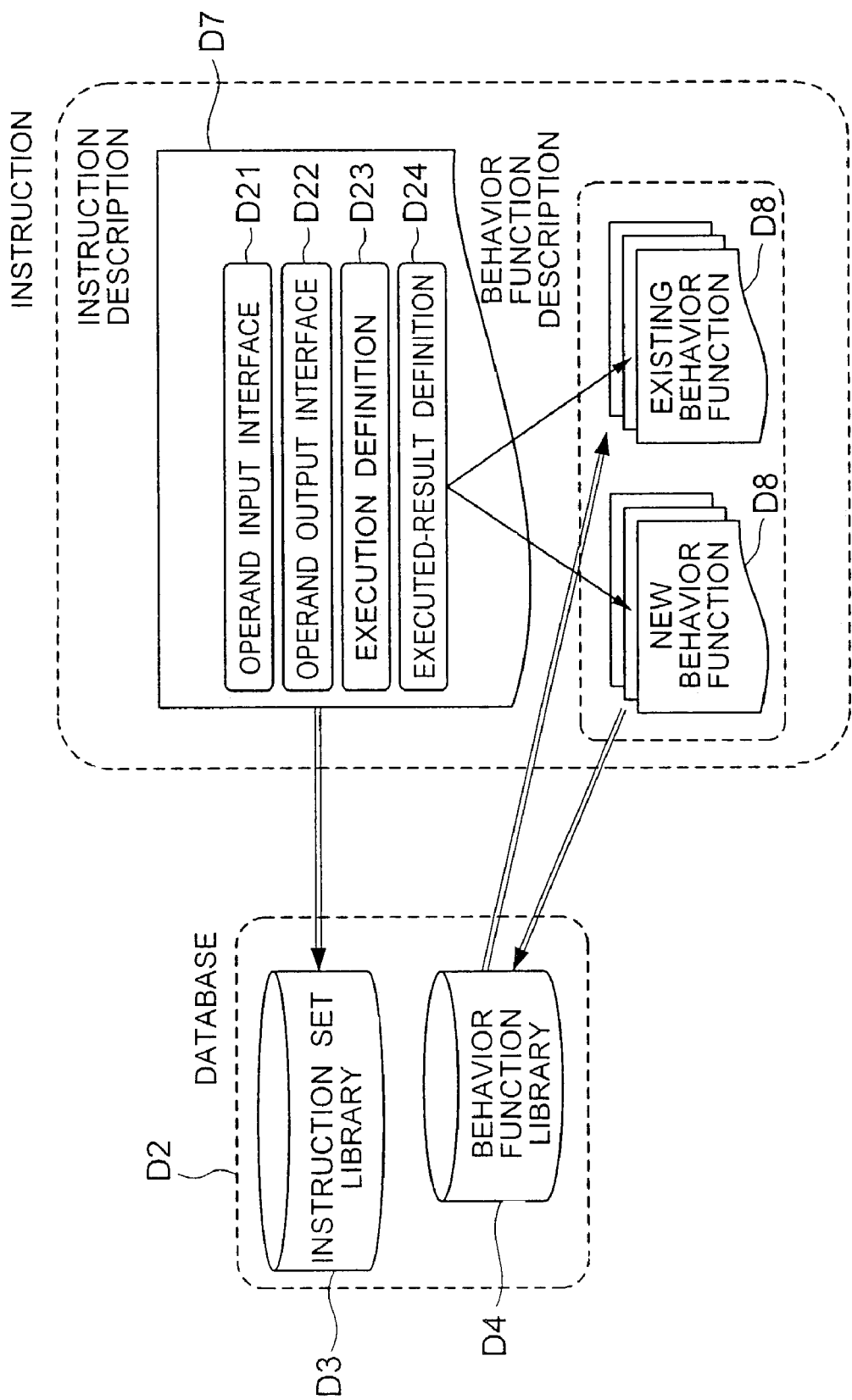
FIG. 3 is a diagram showing the structure of an instruction and a relationship between the instruction and a database.
Figure 5:
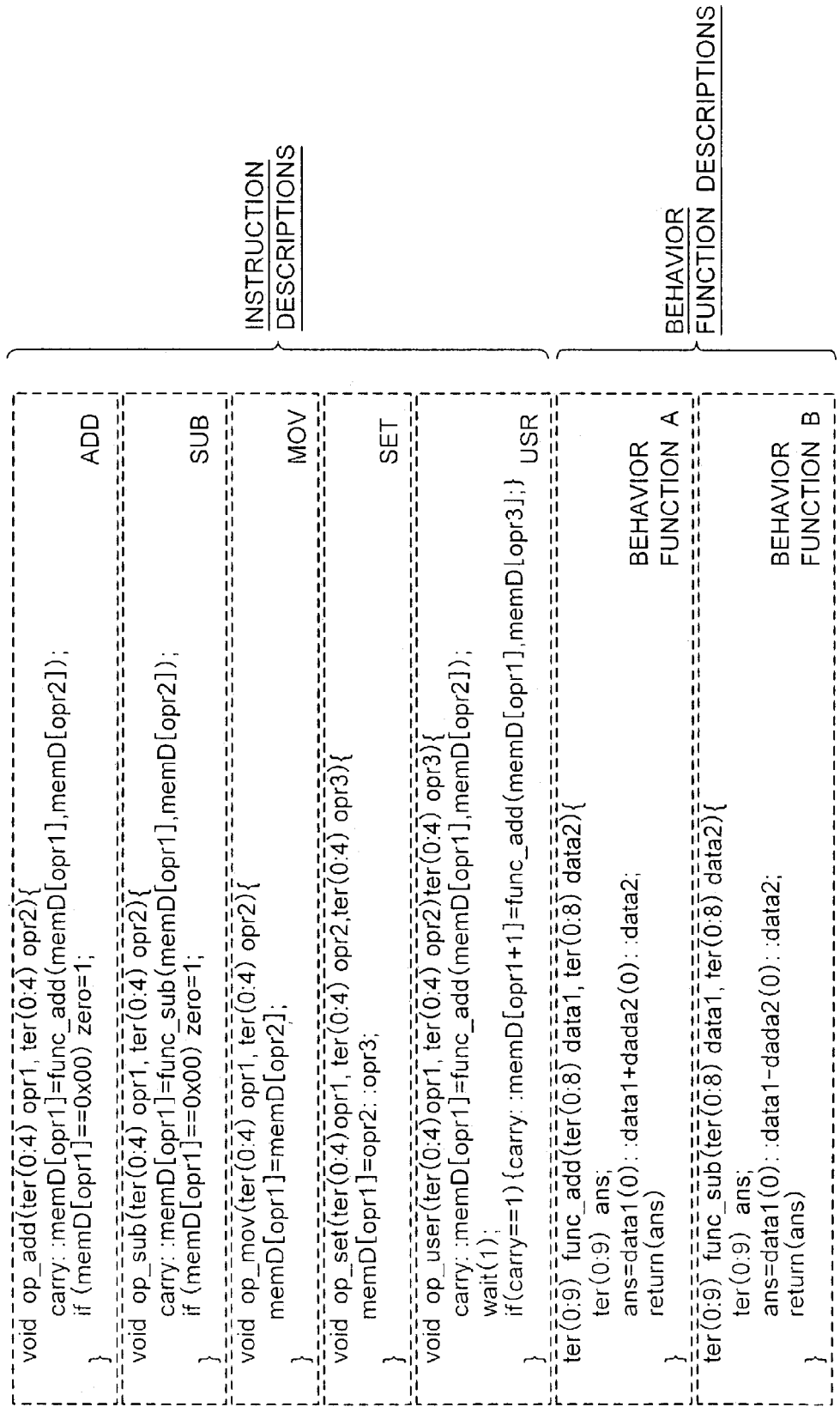
FIG. 5 is an algorithmic diagram showing examples of the instruction descriptions and behavior function descriptions in the system LSI of FIG. 1.
Figure 6:
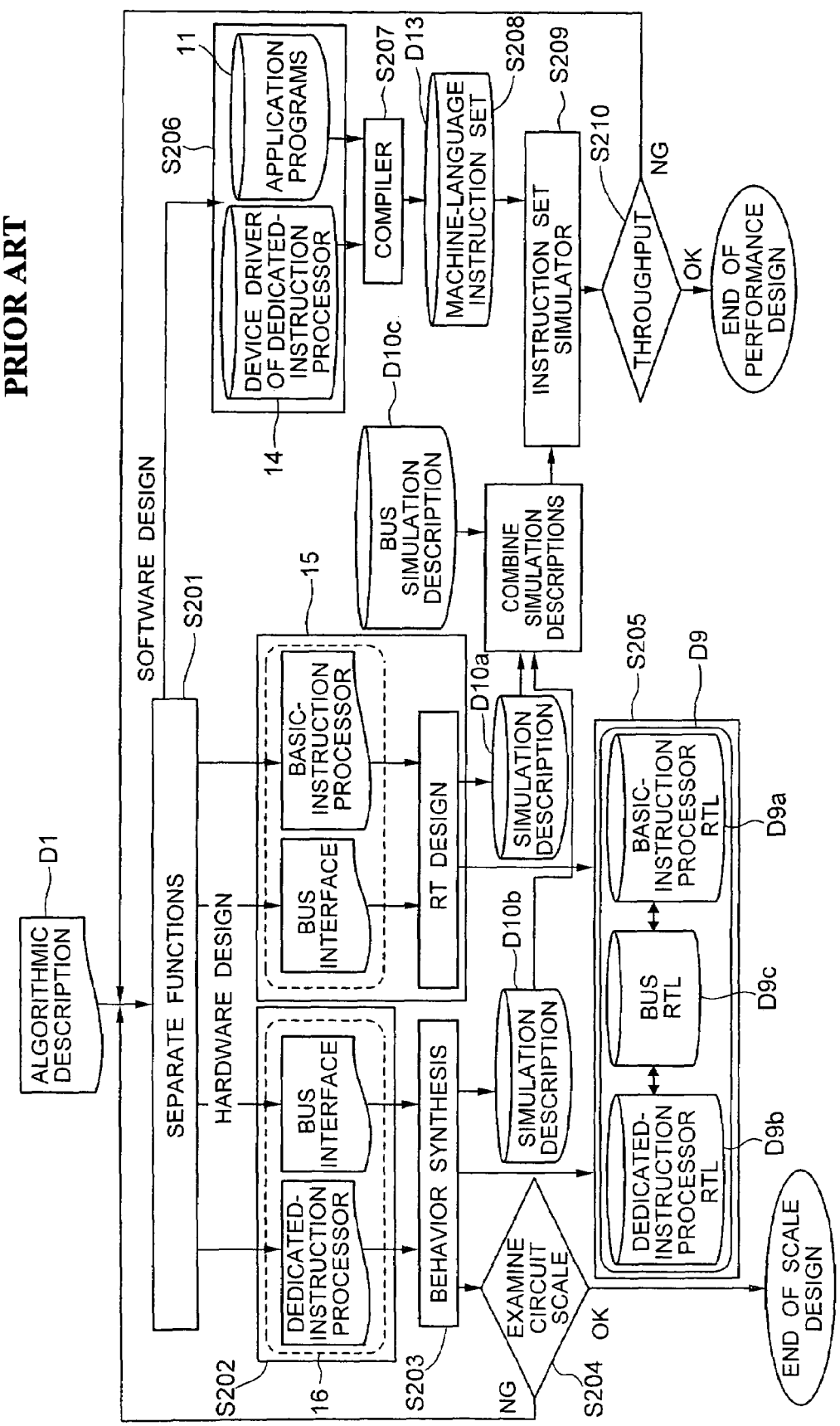
FIG. 6 is a schematic flowchart of a conventional procedure in designing a system LSI.

FIG. 3 shows the relationship between the new instruction and the database D2, whereas FIGS. 4 and 5 show examples of portions of the processor description D5. It is to be noted that an existing instruction is similar to the new instruction shown in FIG. 3, although FIG. 3 exemplifies the new instruction.

As shown in FIG. 3, the new instruction includes a new instruction description D7 which includes an operand input interface section 21, an operand output interface section 22, an execution definition section 23, and an executed-result definition section 24. The execution definition section 24 specifies the behavior function description for defining the concrete processing of the instruction. The executed-result definition section 23 sets a flag based on the result of the execution conducted based on the execution definition section 24. The execution definition section 24 may directly specify a concrete behavior or processing, instead of specifying the behavior function description D8 to define the behavior function therein.

The database D2 includes an instruction set library D3 storing therein the instruction descriptions D7 and a behavior function library D4 storing therein the behavior function descriptions D8, as described before.

The processor description D5 uses a high-level language which bases on a C language. In FIG. 4, first to sixth rows define the instruction codes, eighth to 11th rows define memory resources, 14th to 28th rows define basic instructions including resources, such as adder, subtracter and increment unit, and memory ports. In FIG. 5, the boxes shown by dotted lines correspond to functional blocks of the processor description, wherein top five boxes show the instruction descriptions whereas bottom two boxes show the behavior function descriptions.

Back to FIG. 3, both the operand input interface section 21 and the operand output interface section 22 define the bit width and the number of data input/output by the instruction. The executed-result definition section 23 defines a status flag of the processor, such as a zero flag which shows that the result of calculation assumes zero, and a carry flag which shows that a carry is generated after the calculation.

The execution definition section 24 defines the type and details of the processing executed by the instruction. The execution definition section defines the processing by dividing the processing into a plurality of functional blocks for allowing the functional blocks to be reused with ease, specifying the functional blocks as behavior functions. The behavior function is a simple function of a data path for specifying the returned value based on the result of the calculation. The behavior function D8 can be further divided into a plurality of subordinate functional blocks, which can be specified by the higher functional blocks thereby configuring a hierarchical order of function descriptions, as in the case of ordinary functions described in the C language.

The meaning of descriptions described in the language other than the C language will be exemplified. In the notation of FIG. 4, "process" on 14th row is presented here so that the behavior synthesis tool can recognize a unit to be synthesized. Expression "reg(x:y)" means reservation of a storage wherein x is MSB with a y-bit length. Term "reg(0:8) pc" on the 7th row means an 8-bit program counter. Expression "ter(m:n)" means reservation of a bus signal wherein m is MSB with an n-bit length. For example, the 16th row beginning with "ter(0:4)" means that four bus lines including "opc", "opr1", "opr2" and "opr3" are reserved as four-bit bus lines.

The operator "::" means a specific operator for coupling a plurality of bits. The 18th row means that four 4-bit buses "opc", "opr1", "opr2" and "opr3" are coupled together to be treated as an equivalent 16-bit bus. In FIG. 5, "data1(0) :: data1" described in "func_add" means a data obtained by coupling MSB of data1 with data1. The resultant data has (n+1) bits if data1 has n bits.

The instruction description "ADD" in FIG. 5 will be detailed as an example. This instruction "ADD" instructs addition of an 8-bit data and an 8-bit data, which generates a carry signal. The instruction description of instruction "ADD" defines an operand input interface which inputs "opr1" and "opr2" of 4-bit data, an executed-result definition for setting a carry flag and a zero flag, and an execution definition which specifies and calls the behavior function "A" by using the contents of the addresses "opr1" and "opr2" of the data memory as arguments.

The execution, definition section of instruction "ADD" specifies the behavior function "A" and further defines the processing for substituting the 9-bit return value from the behavior function "A" for the data which includes a 1-bit carry flag and a 8-bit data in the address "opr1" of the data memory. The behavior function "A" is a simple function for a data path, which receives 8-bit "data1" and "data2", substitutes the 9-bit data as a result of addition including a carry bit for a variable "ans", and returns the substituted variable "ans" as a return value to the execution definition section.

The processor operates for five instructions "ADD", "SUB", "MOV", "JMP" and "USR" defined on 20th to 25th rows in FIG. 4. Among the recited instructions, the instructions except for "USR" are stored and registered as versatile instructions in the database D2. In step S3 of FIG. 2, the instruction descriptions of these instructions D6 needed for the processor are extracted from the instruction set library D3 of the database D2, and the extracted instructions D6 including the instruction descriptions and the behavior functions are installed in the processor description D5.

After all the existing instructions need for the processor are extracted, new instructions are designed. In the example of FIG. 5, instruction "USR" is defined. In this step, a new instruction description D7 for "USR" is first prepared, followed by definition of a behavior function. If an existing behavior function registered in the database is available as the new behavior function, the existing behavior function is reused. If such an existing behavior function is not registered, a new behavior function is prepared.

In the example of FIG. 5, instruction "USR" defines algorithms for executing behavior function "A", and then executing behavior function "A" again after one clock cycle depending on the value of the carry flag. In this case, instruction "USR" takes two clock cycles. With reference to the behavior function library, it is found that behavior function "A" generally used in instruction "ADD" is registered as a behavior function available for a 8-bit addition. Thus, the design for instruction "USR" can be achieved by defining an execution definition section, which achieves the desired algorithm, while using behavior function "A" without preparing a new behavior function.

In the present embodiment, each of the existing instructions is registered in the database as design resources after diving the same into two descriptions including the instruction description and the behavior function description. Thus, an optimum instructions can be configured and installed in the processor while reusing the existing instructions.

In addition, since the behavior function is registered as a simple function for a data path which returns the result of the calculation as a return value, the registered behavior function has a higher versatility. This allows addition of a new instruction to be achieved by reusing the existing behavior function stored in the behavior function library, thereby reducing the cost and time length for designing a system LSI. In other words, a user-specific processor having a minimum instruction architecture can be obtained while reducing the cost and time length for implementing the desired algorithms.

A new instruction is registered in the instruction set library after design thereof, whereas a new behavior function is registered in the behavior function library, both allowing the reuse thereof in the design of next LSIs. Since the existing instructions and the existing behavior functions are already verified by the past design verification, it is sufficient that the new instructions be verified for the safe operation. By using the highly reliable design resources, the verification can be simplified.

The behavior function, which may be a simple function, can be implemented by a hardware macro block. In general, a hardware designed manually has advantages over a hardware obtained by behavior synthesis of the algorithms in that the former has a higher operational speed and a smaller circuit scale. However, the former has disadvantages compared to the latter in that the former needs a longer design time and a complicated verification procedure. Thus, it is preferable that some of the behavior functions having a higher versatility are manually designed, implemented by hardware macros and stored as the design resources, while considering the required performance, design time length and design cost of the processor.

There arises a case wherein addition or modification of an instruction is desired in the hardware of the processor for achieving a change of specification, improvement of the performance or correction of a malfunction after the processor is implemented as a hardware. In the present embodiment, the addition or modification of the instruction may be achieved by connecting the hardware macro implementing the behavior function to a programmable logic circuit, which can be programmed to implement a new instruction description having an execution definition section specifying the behavior function. In an alternative, or in addition thereto, a programmable logic circuit may be provided which can be programmed to implement a desired behavior function.

Since the above embodiments are described only for examples, the present invention is not limited to the above embodiments and various modifications or alterations can be easily made therefrom by those skilled in the art without departing from the scope of the present invention.

What is claimed is:

1. A method for designing a processor of a system LSI, comprising the steps of:
    selecting an instruction description and a behavior function description (D8) stored in a database; and
    synthesizing an instruction by behavior synthesis using said selected instruction description and said selected behavior function.

2. The method according to claim 1, wherein the behavior function description and the instruction description are separately stored in a database.

3. The method according to claim 2, further comprising the step of retrieving an instruction description from the database, before said instructions synthesizing step, wherein the instruction description is retrieved as an instruction from the database while being accompanied by the behavior function description.

4. The method according to claim 3, further comprising, before said synthesizing step, the step of providing an instruction definition table tabulating instructions retrieved from the database and the instruction defined in said defining step.

5. The method according to claim 1, wherein the processor designed includes a fixed logic circuit section having a function defined by the behavior function description, and a programmable logic circuit section having a function defined by the instruction description.

6. The method according to claim 5, wherein said synthesizing step includes the steps of designing the programmable logic circuit section having functions defined by the behavior function description, and programming the programmable logic circuit based on the instruction description specifying the behavior function description.

7. The method according to claim 1 wherein said synthesizing step provides a simulation description defining a simulation for simulating the processor.

8. The method according to claim 7, further comprising the step of simulating the processor based on the simulation description and application programs to be run on the processor.

9. The method according to claim 1, wherein the behavior function description and the instruction description are described by a C language, an extended C language, and an object-oriented language.

10. A recording medium storing therein a software defining the method according to claim 1.

11. The method according to claim 1, wherein said synthesizing step synthesizes said selected instruction description and said selected behavior function description.

12. The method according to claim 1, wherein said synthesizing step includes the steps of modifying said selected instruction description to form a new instruction description and synthesizing said new instruction description and said selected behavior function.

13. The method according to claim 12, further comprising the step of storing said synthesized instruction in said database after separating said new instruction description from said selected behavior function.

14. The method according to claim 1, wherein said synthesizing step includes the steps of modifying said behavior function description to form a new behavior function description, and synthesizing said selected instruction description and said new behavior function.

15. The method according to claim 1, wherein said synthesizing step includes the step of combining said selected behavior function and a new behavior function to form a combined behavior function, and synthesizing said selected instruction description and said combined behavior function.

16. The method according to claim 15, further comprising the step of storing said synthesized instruction in said database after separating said selected instruction description from said combined behavior function.

17. A method of designing a processor of a system LSI, comprising:
    defining instructions for the processor; and
    synthesizing the instructions by behavior synthesis to design the processor,
    wherein at least one of the instructions defined by said defining step includes a behavior function description and an instruction description specifying the behavior function description,
    wherein the behavior function description and the instruction description are separately stored in a database.
    wherein the database is open to another party while inhibiting the another party from accessing some of contents of at least one of the behavior function description and the instruction description stored in the database.

18. A method of designing a processor of a system LSJ, comprising:
    defining instructions for the processor; and
    synthesizing the instructions by behavior synthesis to design the processor,
    wherein at least one of the instructions defined by said defining step includes a behavior function description and an instruction description specifying the behavior function description,
    wherein the behavior function description and the instruction description are separately stored in a database,
    wherein the database is open to another party while inhibiting the another party from updating some of at least one of the behavior function description and the instruction description.

19. A method of designing a processor of a system LSI, comprising:
    defining instructions for the processor; and
    synthesizing the instructions by behavior synthesis to design the processor,
    wherein at least one of the instructions defined by said defining step includes a behavior function description and an instruction description specifying the behavior function description,
    wherein the behavior function description and the instruction description are separately stored in a database,
    wherein the database stores a plurality of behavior function descriptions in a hierarchical order.

20. A method of designing a processor of a system LSI, comprising:
    defining instructions for the processor; and
    synthesizing the instructions by behavior synthesis to design the processor,
    wherein at least one of the instructions defined by said defining step includes a behavior function description and an instruction description specifying the behavior function description,
    wherein the instruction description includes an operand input interface section, an operand output interface section, an execution definition section for executing instructions by specifying the behavior function description and an executed-result definition section for setting a flag based on a result of the execution defined by the execution definition section.

* * * * *